United States Patent
Krishnamachari et al.

(10) Patent No.: US 7,057,934 B2
(45) Date of Patent: Jun. 6, 2006

(54) FLASH MEMORY WITH COARSE/FINE GATE STEP PROGRAMMING

(75) Inventors: Sreeram Krishnamachari, Folsom, CA (US); Karthikeyan Ramamurthi, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 64 days.

(21) Appl. No.: 10/880,357

(22) Filed: Jun. 29, 2004

(65) Prior Publication Data

US 2005/0286304 A1    Dec. 29, 2005

(51) Int. Cl.
*G11C 16/04*    (2006.01)

(52) U.S. Cl. .......................... 365/185.19; 365/185.14; 365/185.01

(58) Field of Classification Search ............ 365/185.19, 365/185.22, 185.14, 185.01, 185.04
See application file for complete search history.

(56) References Cited

U.S. PATENT DOCUMENTS

| | | | |
|---|---|---|---|
| 6,700,820 B1 | 3/2004 | Elmhurst et al. | |
| 6,744,670 B1 * | 6/2004 | Tamada et al. | 365/185.19 |
| 6,747,893 B1 | 6/2004 | Uribe | |
| 6,894,929 B1 * | 5/2005 | Matsuoka et al. | 365/185.14 |
| 6,937,520 B1 * | 8/2005 | Ono et al. | 365/185.18 |
| 6,954,446 B1 * | 10/2005 | Kuffner | 370/335 |
| 2004/0156241 A1 * | 8/2004 | Mokhlesi et al. | 365/185.28 |

* cited by examiner

*Primary Examiner*—Richard Elms
*Assistant Examiner*—N Nguyen
(74) *Attorney, Agent, or Firm*—Dana B. LeMoine, LeMoine Patent Services, PLLC

(57) ABSTRACT

A flash memory includes multi-level cells (MLC) that are programmed with a combination of coarse gate voltage steps and fine gate voltage steps. The multi-level cells include floating gate transistors that are programmed by modifying the threshold voltages of the floating gate transistors. Coarse gate voltage steps are used until the threshold voltage any of the transistors being programmed reaches a reference value, and fine steps are used thereafter.

24 Claims, 6 Drawing Sheets

FLASH MEMORY WITH COARSE/FINE GATE STEP PROGRAMMING

FIELD

The present invention relates generally to memory circuits, and more specifically to flash memory circuits.

BACKGROUND

Multilevel cell flash memory includes floating gate transistors with programmable threshold voltages. When programming multilevel flash cells, care must be taken to store the right amount of charge on the floating gate so that the flash cells may later be reliably read.

DESCRIPTION OF EMBODIMENTS

Figure 1:
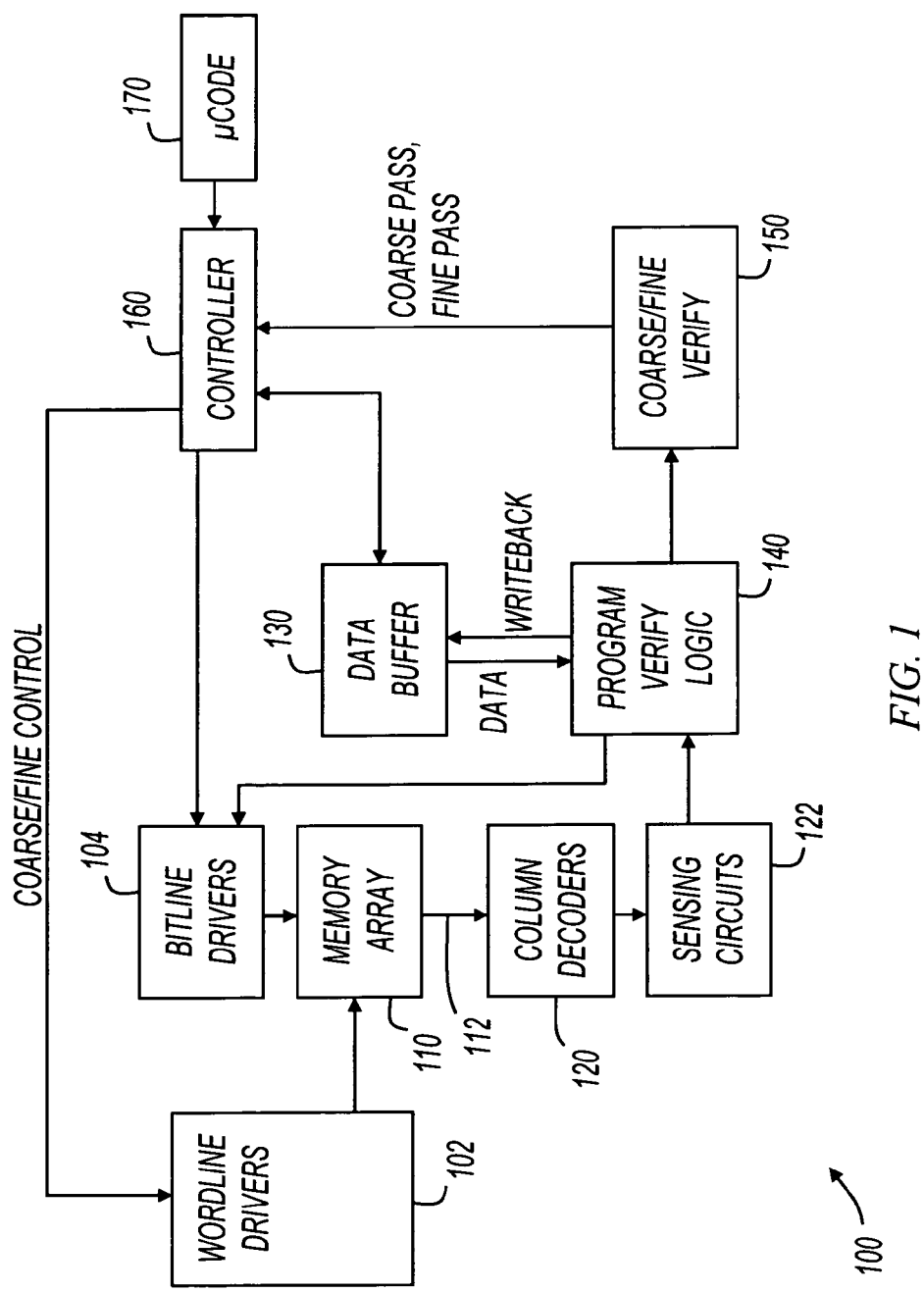
FIG. 1 shows a block diagram of a flash memory device.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a block diagram of a flash memory device. Flash memory device 100 includes memory array 110, word line drivers 102, bit line drivers 104, column decoders 120, sensing circuits 122, data buffer 130, program verify logic 140, coarse/fine verify circuit 150, controller 160, and microcode 170. Memory array 110 is a nonvolatile memory array that maintains its state when power is removed. For example, memory array 110 may be a flash memory that includes memory cells having floating gate transistors. An example floating gate transistor is described below with reference to FIG. 2.

Flash memory device 100 may include functional blocks and signal lines not shown in FIG. 1. For example, flash memory device 100 may include a write interface circuit or a read interface circuit that couples various portions of flash memory device 100 to an external bus. Further, flash memory device 100 may include signal lines from one or more interface circuits to controller 160, data buffer 130, or any other block shown in FIG. 1. The blocks that are shown in FIG. 1 were chosen to support an explanation of various embodiments relating to the programming of memory array 110.

Controller 160 may be any type of suitable controller able to effect programming operations within flash memory device 100. For example, controller may be an embedded microprocessor, microcontroller, or the like. In operation, controller 160 receives and executes software instructions from microcode 170. Microcode 170 may be held in a nonvolatile memory element such as a separate flash memory. The manner in which processor 160 and microcode 170 are implemented is not a limitation of the present invention.

When programming memory array 110, data to be programmed is placed in data buffer 130. In some embodiments, data is placed in data buffer 130 by controller 160. Further, a programming operation may program a subset of memory array 110, and data buffer 130 may only hold data to program the subset. During a programming operation, bit line drivers 104 drive appropriate voltages on bit lines within memory array 110, and word line drivers 102 provide programming pulses on word lines within memory array 110.

In some embodiments, memory array 110 is a flash memory that includes an array of multilevel cells (MLC). For example, each multilevel cell may support four different program states represented by different threshold voltages on a floating gate transistor. These four states may be represented as level zero (L0), level one (L1), level two (L2), and level three (L3), where L0 corresponds to an unprogrammed flash cell with a lowest threshold voltage, L3 corresponds to a programmed flash cell with a highest threshold voltage, and L1 and L2 correspond to programmed flash cells with intermediate threshold voltages. L3, L2, L1, and L0 are also represented as "00," "01," "10," and "11," respectively.

In MLC embodiments, data buffer 130 is loaded with values in pairs to be programmed into memory array 130. For example, because each flash cell may be programmed with two bits of information, data buffer 130 is loaded with data bits in pairs that represent levels L0, L1, L2, and L3. Because erased flash cells hold all ones, MLC flash cells that are to be programmed with L0, or "11," need not be programmed at all. The various embodiments of the present invention recognize that cells that are to hold "11" need not be programmed, that cells that are to hold "00" may be programmed to a high threshold voltage, and that cells that are to hold "10" or "01" may be programmed to intermediate threshold voltages. The threshold voltages corresponding to the various programmed states are defined to be a sufficient distance from each other so as to allow reliable reading of the MLC flash cells.

In some embodiments, flash memory device 100 supports programming MLC cells within memory array 110 using multiple pulses on word lines where the pulses are at different voltages. Further, flash memory device 100 supports incrementing gate voltages on word lines in coarse steps until the programmed values approach the desired intermediate threshold voltages, and then continuing to increment gate voltages on word lines in fine steps until the programmed values meet or exceed a pre-determined level. Various programming embodiments utilizing coarse and fine word line voltage steps are described further below. As used herein, the term "coarse pulse" refers to a programming pulse that is applied after a coarse step in word line voltage, and the term "fine pulse" refers to a programming pulse that is applied after a fine step in word line voltage.

During programming, controller 160 controls bit line drivers 104 and word line drivers 102 to provide appropriate voltages on bit lines, and coarse and fine gate voltage steps on word lines. In some embodiments, controller 160 includes voltage reference circuits to provide the various voltages, and line drivers 104 and word line drivers 102 include switches to select a voltage. In other embodiments, bit line drivers 104 and word line drivers 102 include voltage generation circuitry and controller 160 provides digital control information to cause bit line drivers 104 and word line drivers 102 to drive various voltages on bit lines and word lines. The manner in which voltages are generated or routed to bit lines and word lines is not a limitation of the present invention.

Flash memory array 110 may use one logical path for programming and another logical path for reading/verifying. This allows the paths to be Read While Write (RWW) enabled and allows verification of programming during the programming operation. For example, a current on data lines 112 may change as the flash cells are programmed. In some embodiments, word line drivers 102 drive a "read voltage" on the word lines between programming operations to perform a "verify" operation. Various embodiments of the present invention utilize two different types of verify operations: "coarse verify" and "fine verify." Coarse verify and fine verify are described further below.

During a coarse verify (after a coarse pulse) or during a fine verify (after a fine pulse, column decoders 120 receive data from memory array 110 and direct that data to sensing circuits 122. Sensing circuits 122 may include one or more reference circuits that provide reference levels to which the data may be compared. For example, the data may be in the form of a current, and the reference circuits may include programmed flash cells that provide reference currents. In some embodiments, multiple references exist for each level. For example, sensing circuits 122 may include a L1 coarse reference, a L1 fine reference, a L2 coarse reference, a L2 fine reference, and a L3 reference. The operation of coarse and fine references for intermediate states L1 and L2 are described further below.

Program verify logic 140 includes logic to compare the output of sensing circuits 122 with data from data buffer 130. For example, during a coarse verify, sensing circuits 122 generate digital output signals by comparing the output of column decoders 120 with a coarse reference, and these digital output signals are compared to data in data buffer 130 by program verify logic 140. In some embodiments, multiple locations within memory array 110 are programmed simultaneously, and during a verify operation, multiple locations within memory array 110 are verified simultaneously. For example, in some embodiments, program verify logic 140 may verify 32 locations within memory array 110 simultaneously. Further, in some embodiments, the number of locations programmed simultaneously within memory array 110 may be variable based on the communication bandwidth of various buses, or the current capability of a program pump within flash memory device 100.

Coarse/fine verify circuit 150 receives information from program verify logic 140 and provides information to controller 160. During a coarse verify operation, coarse/fine verify circuit 150 detects if any of the cells being programmed have exceeded the corresponding coarse reference, and if so, asserts the "coarse pass" signal to controller 160. In some embodiments, a coarse verify operation is performed on all cells currently being programmed with either L1 or L2. In these embodiments, if even one cell exceeds the corresponding coarse reference, coarse/fine verify circuit 150 will assert the coarse pass signal. By asserting the coarse pass signal, coarse/fine verify circuit 150 causes controller 160 to switch from coarse gate voltage steps to fine gate voltage steps.

After controller 160 has received a coarse pass signal, controller 160 influences the operation of word line drivers 102 to cause fine gate voltage steps on word lines within memory array 110. During a fine verify operation (after a fine pulse), sensing circuits 122 compare the output of column decoders 120 with corresponding fine references. For example, data in a location being programmed with L1 is compared to a L1 fine reference, and data in a location being programmed with L2 is compared to a L2 fine reference. Also during a fine verify operation, program verify logic 140 compares the output of sensing circuits 122 and data from data buffer 130. For locations that meet or exceed the corresponding fine reference, program verify logic 140 writes a "11" in data buffer 130. For locations that do not meet or exceed the corresponding fine reference, program verify logic 140 does not change the data in data buffer 130. Fine pulses are then repeated, but not for those locations that have met or exceeded the fine reference because the data in data buffer 130 corresponding to those locations is now "11." The "fine pass" signal is asserted only when all cells being programmed have been programmed correctly. The operation of some embodiments of program verify logic 140 is shown below in Tables 1 and 2.

TABLE 1

Coarse Verify Operation

| | Data buffer data | Flash array Level | Write back data to DB | Data to Verify Circuit 150 | Coarse Pass |
|---|---|---|---|---|---|
| Cell[i] | L1(10) | L1(10) | L1(10) | Asserted | Asserted |
| Cell[j] | L1(10) | L0(11) | L1(10) | De-asserted | |
| Cell[k] | L2(01) | L2(01) | L2(01) | Asserted | |
| Cell[m] | L2(01) | L0(11) | L2(01) | De-asserted | |

TABLE 2

Fine Verify Operation

| | Data buffer data | Flash array Level | Write back data to DB | Data to Verify Circuit 150 | Fine Pass |
|---|---|---|---|---|---|
| Cell[i] | L1(10) | L1(10) | L0(11) | Asserted | De-asserted |
| Cell[j] | L1(10) | L0(11) | L1(10) | De-asserted | |
| Cell[k] | L2(01) | L2(01) | L0(11) | Asserted | |
| Cell[m] | L2(01) | L0(11) | L2(01) | De-asserted | |

Table 1 shows the operation of program verify logic 140 when performing coarse verify operations. Cell[i], cell [j], cell[k], and cell [m] are all being programmed. Cells i and k have passed the coarse threshold for their respective levels (L1 and L2) and cells j and m have not. The coarse pass signal is asserted because at least one cell has passed the coarse threshold. Table 1 also shows write back data that may be written back to data buffer 130. In some embodiments, program verify logic 140 writes data back to data buffer 130 during every verify operation, but in the case of coarse verify operations, the data written back is always the same that already exists in the buffer.

Table 2 shows the operation of program verify logic 140 when performing fine verify operations. Cell[i], cell [j], cell[k], and cell [m] are all being programmed. Cells i and k have passed the fine threshold for their respective levels (L1 and L2) and cells j and m have not. The fine pass signal is not asserted because at least one cell has not passed the fine threshold. Table 2 also shows write back data that may be written back to data buffer 130. In the case of fine verify operations, program verify logic 140 writes back "11" to locations corresponding to memory locations that have passed the fine threshold so that they will not be pulsed again. Fine pulsing and verifying continues until all cells pass the fine verify operation, and then the fine pass signal is asserted.

Figure 2:
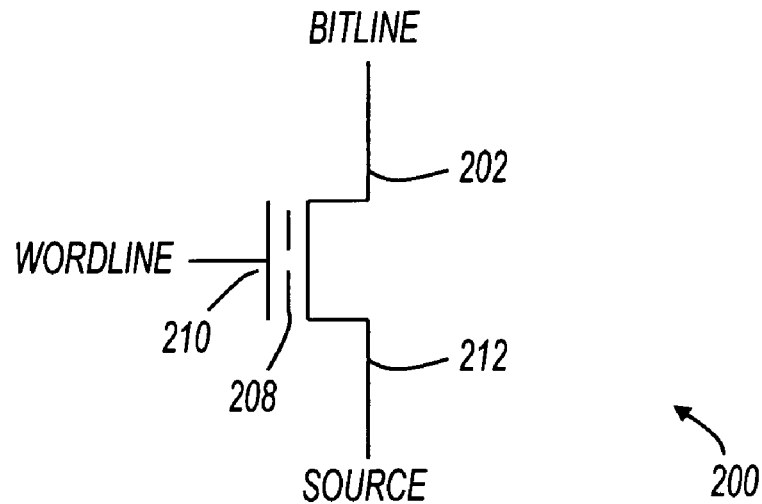
FIG. 2 shows a schematic representation of a floating gate transistor.

FIG. 2 shows a schematic representation of a floating gate transistor. Floating gate transistor 200 may be used in memory array 130 (FIG. 1) as a multilevel cell (MLC). Floating gate transistor 200 includes a channel region between drain node 202 and source node 212, and control gate 210 over the channel region. In addition, floating gate transistor 200 has a floating gate (shown schematically at 208) between the control gate and the channel region. Floating gate 208 is electrically isolated from the control gate and the channel region when nominal voltages are applied across the various terminals. A flash memory device may have a large number of floating gate transistor flash cells in an array where the control gate of each flash cell is connected to a word line and the drain is connected to a bit line, the flash cells being arranged in a grid of word lines and bit lines.

A flash cell may be programmed by inducing hot electron injection from the channel region to the floating gate through the gate oxide by applying a relatively high control gate voltage and nominal drain voltage. The voltage at the control gate determines the amount of charge residing on the floating gate after programming. The charge affects current in the channel region by determining the voltage that must be applied to the control gate in order to allow the flash cell to conduct current between the source and the drain. This "threshold voltage" of the flash cell is the physical form of the data stored in the flash cell. As the charge on the floating gate increases the threshold voltage also increases.

As described above with reference to FIG. 1, a floating gate transistor may be programmed to one of multiple states. For example, a multilevel cell (MLC) may be capable of storing two or more bits of data in a single memory cell. When storing two bits of data, a multilevel flash memory cell has four distinct threshold voltage levels over a voltage range. Each distinct threshold voltage of floating gate transistor 200 corresponds to levels L0, L1, L2, and L3, described above with reference to FIG. 1.

Figure 3:
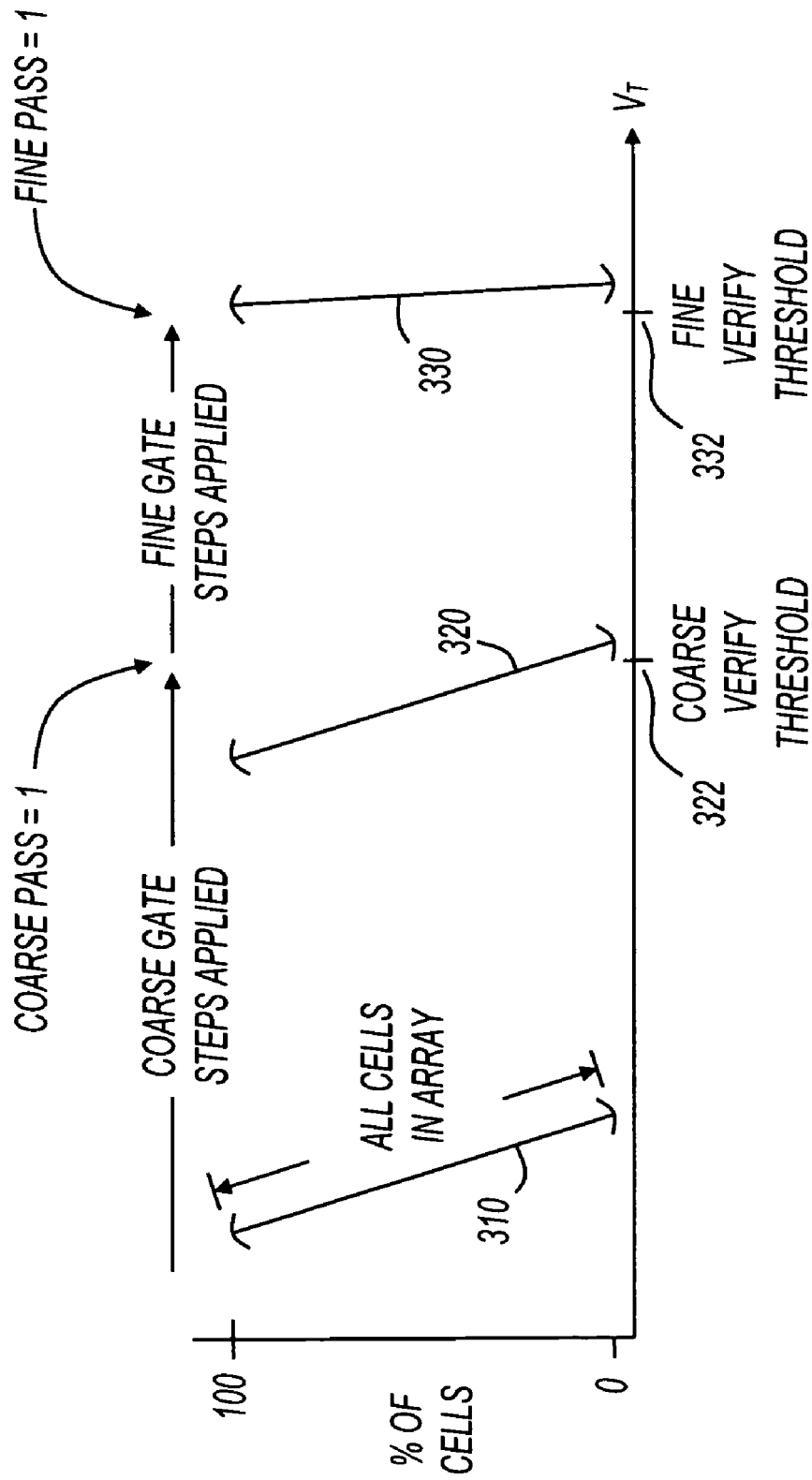
FIG. 3 shows a progression of threshold voltages when programming with coarse and fine gate voltage steps.

FIG. 3 shows a progression of threshold voltages when programming with coarse and fine gate voltage steps. The horizontal axis in FIG. 3 corresponds to threshold voltage, and the vertical axis in FIG. 3 corresponds to the percentage of cells in a memory array. The distribution of all unprogrammed cells in a memory array is shown at 310. Moving left to right in FIG. 3, coarse gates steps are applied to program the cells in the array. For simplicity, the distribution moves from left to right as though all cells were being programmed with a single intermediate threshold voltage. For example, the behavior represented in FIG. 3 may represent all cells being programmed to intermediate level L1, whereas in actual practice, a mixture of cells being programmed to intermediate levels L1 and L2 may be present.

Any number of coarse gate steps may be applied to move the distribution from 310 to 320. In some embodiments, the size of the coarse gate step is designed such that one coarse gate step will move the distribution from 310 to 320. In other embodiments, the size of the coarse gate step is designed such that two coarse gate steps will move the distribution from 310 to 320. Coarse gate steps are repeated until at least one floating gate transistor has a threshold voltage that surpasses coarse verify threshold 322. At 320, at least one floating gate transistor has a threshold voltage that surpasses coarse verify threshold 322. Coarse verify threshold 322 corresponds to a coarse reference within sensing circuits 122 (FIG. 1). Once at least one floating gate transistor meets or exceeds the coarse verify threshold, coarse/fine verify circuit 150 (FIG. 1) asserts the coarse pass signal, and a transition is made to fine gate steps.

After the memory array has passed coarse verify, fine gate voltage steps are applied and gates of floating gate transistors are pulsed to move the distribution further to the right in FIG. 3, with a goal of having every floating gate transistor meet or exceed the fine verify threshold at 332. As described above with reference to FIG. 1, each cell receives fine pulses until it meets or exceeds the fine verify threshold, and is then no longer pulsed. Other cells that have not yet met the fine verify threshold continue to be pulsed until they meet or exceed the fine verify threshold. The distribution of cells may become slightly smaller at 330 because as each cell crosses the fine verify threshold 332, it is removed from the set of cells to be re-pulsed, and also because the fine steps are smaller than the coarse steps. When every cell meets the fine verify threshold 332, coarse/fine verify circuit 150 (FIG. 1) asserts the fine pass signal, and programming is complete.

Figure 4:
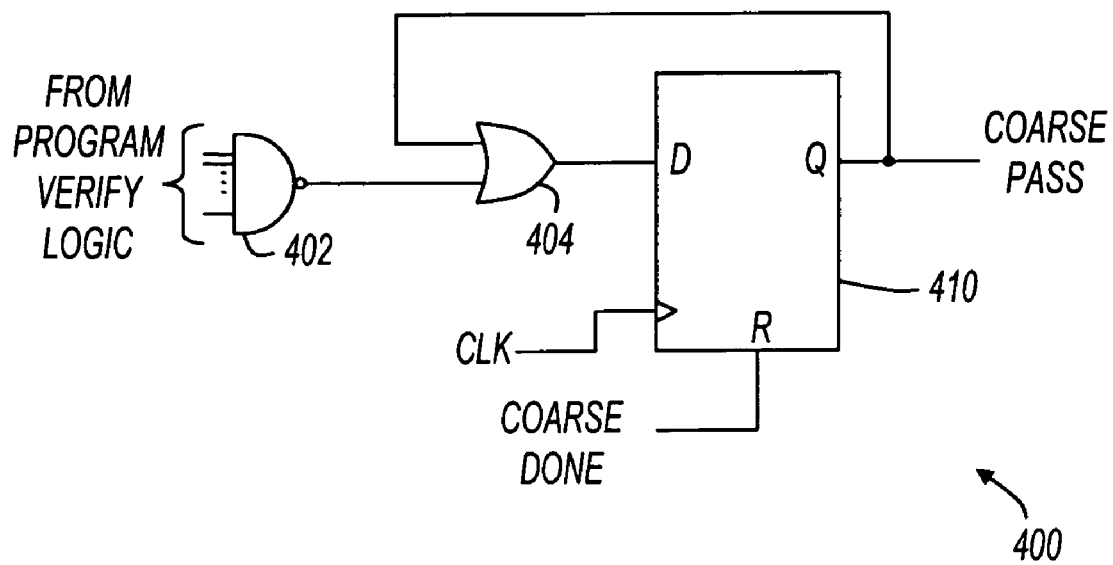
FIG. 4 shows a schematic of a coarse verify circuit.

FIG. 4 shows a schematic of a coarse verify circuit. Coarse verify circuit 400 may be used as part of a coarse/fine verify circuit in a flash memory device. For example, coarse verify circuit 400 may be used in coarse/fine verify circuit 150 (FIG. 1). Coarse verify circuit 400 includes gates 402 and 404, and register 410. Gate 402 is a NAND gate that receives active low asserted signals from program verify logic. For example, when a coarse threshold is met by a particular memory cell, then a signal line corresponding to that memory cell input to NAND gate 402 will transition low. This causes the input to OR gate 404 to transition high, and causes register 410 to latch a "1," and assert the coarse pass signal. After the transition to fine gate steps is made, the "coarse done" signal may be asserted to reset register 410 in preparation for the next use of coarse verify circuit 400. The coarse done signal may be asserted by a controller such as controller 160 (FIG. 1).

Figure 5:
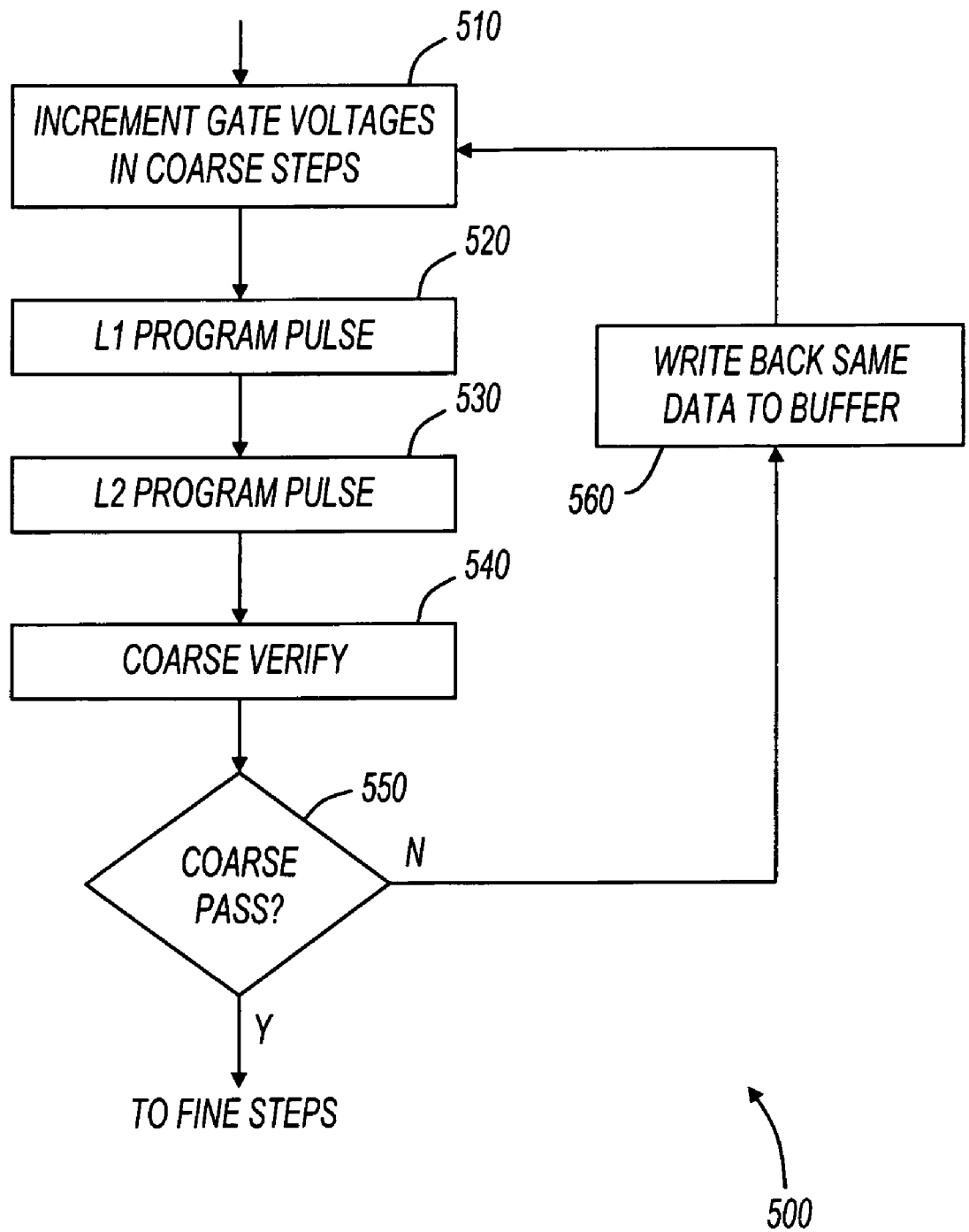
FIGS. 5 and 6 show flowcharts in accordance with various embodiments of the present invention.
Figure 6:
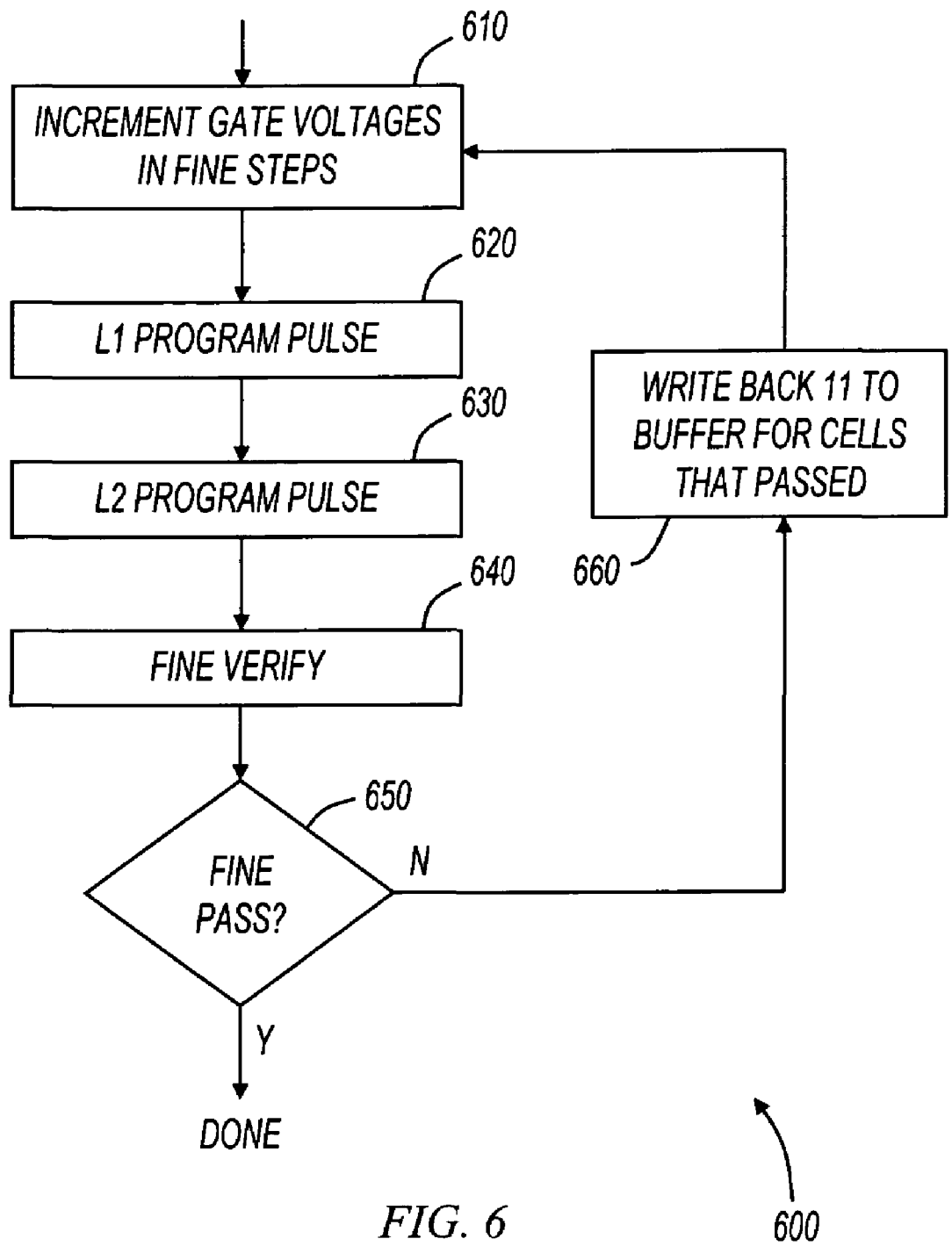

FIGS. 5 and 6 show flowcharts in accordance with various embodiments of the present invention. In some embodiments, methods 500 and 600 may be used to program a flash memory device. In some embodiments, methods 500 and 600, or portions thereof, are performed by a controller in a flash memory device, embodiments of which are shown in the various figures. In other embodiments, method 500 is performed by a combination of hardware and software in a flash memory device. Methods 500 and 600 are not limited by the particular type of apparatus or software element performing the method. The various actions in methods 500 and 600 may be performed in the order presented, or may be performed in a different order. Further, in some embodiments, some actions listed in FIGS. 5 and 6 are omitted from methods 500 and 600.

Referring now to FIG. 5, method 500 is shown beginning at block 510 in which gate voltages are incremented in coarse steps. At 520, gates of floating gate transistors being programmed with level L1 are pulsed, and at 530, gates of floating gate transistors being programmed with level L2 are pulsed. At 540, a coarse verify is performed. If the coarse pass signal is asserted at 550, method 500 continues with fine steps. An example of fine steps is described below with reference to FIG. 6. If the coarse pass signal is not asserted at 550, then the same data is written back to the buffer at 560, and gate voltages are again incremented in coarse steps at 510. In some embodiments, no data is written back to the data buffer during coarse verify operations. The loop in method 500 may be performed as many times as necessary and held at least one transistor passes the coarse verify at 540.

Referring now to FIG. 6, method 600 is shown beginning at block 610 in which the gate voltages are incremented in fine steps. At 620, gates of floating gate transistors being programmed with level L1 are pulsed, and at 630, gates of floating gate transistors being programmed with level L2 are pulsed. At 640, a fine verify is performed. If the fine pass signal is asserted at 650, method 600 is completed and programming of levels L1 and L2 is done. If the fine pass signal is not asserted at 650, then locations in the buffer that correspond to cells that passed are written with "11," removing the cells that passed from the set to be re-pulsed on the next time through the loop. Gate voltages are incremented in fine steps again at 610, and the loop repeats until each cell passes the fine verify and the fine pass signal is asserted.

Figure 7:
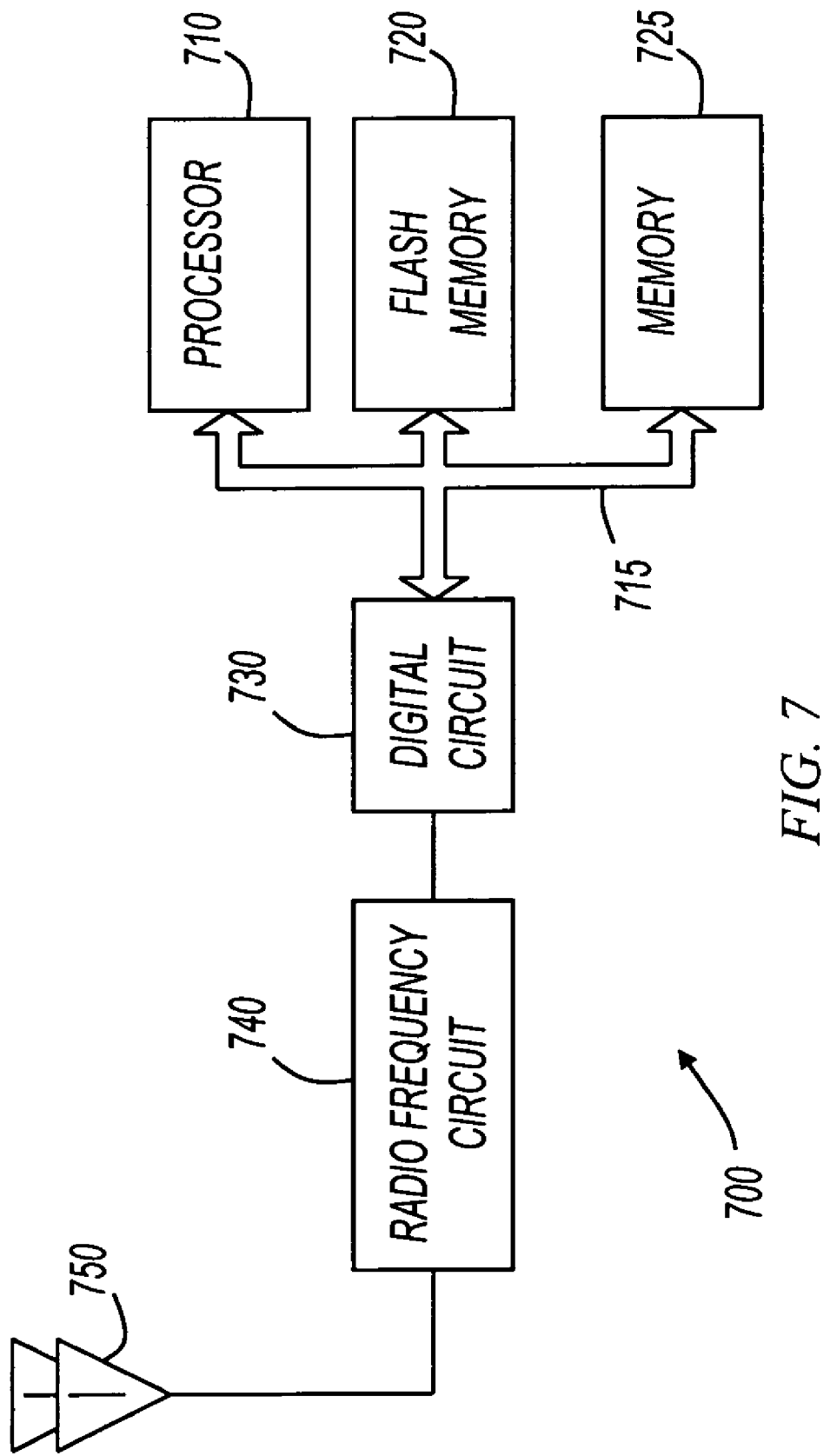
FIG. 7 shows a diagram of an electronic system in accordance with various embodiments of the present invention.

FIG. 7 shows a system diagram in accordance with various embodiments of the present invention. Electronic system 700 includes processor 710, flash memory device 720, memory 725, digital circuit 730, radio frequency (RF) circuit 740, and antennas 750. Processor 710 may be any type of processor adapted to access flash memory device 720 and memory 725. For example, in some embodiments, processor 710 may be a microprocessor, a digital signal processor, a microcontroller, or the like.

Example systems represented by FIG. 7 include cellular phones, personal digital assistants, wireless local area network interfaces, or any other suitable system. Flash memory device 720 may be adapted to hold information for system 700. For example, flash memory device 720 may hold device configuration data, such as contact information with phone numbers, or settings for digital circuit 730 or RF circuit 740. Further, flash memory device 720 may hold multimedia files such as photographs or music files. Still further, flash memory device 720 may hold program code to be executed by processor 710. Flash memory device 720 may be any of the flash memory embodiments described herein, including flash memory device 100 (FIG. 1). Many other systems uses for flash memory device 720 exist. For example, flash memory device 720 may be used in a desktop computer, a network bridge or router, or any other system without an antenna.

Radio frequency circuit 740 communicates with antennas 750 and digital circuit 730. In some embodiments, RF circuit 740 includes a physical interface (PHY) corresponding to a communications protocol. For example, RF circuit 740 may include modulators, demodulators, mixers, frequency synthesizers, low noise amplifiers, power amplifiers, and the like. In some embodiments, RF circuit 740 may include a heterodyne receiver, and in other embodiments, RF circuit 740 may include a direct conversion receiver. In some embodiments, RF circuit 740 may include multiple receivers. For example, in embodiments with multiple antennas 750, each antenna may be coupled to a corresponding receiver. In operation, RF circuit 740 receives communications signals from antennas 750, and provides signals to digital circuit 730. Further, digital circuit 730 may provide signals to RF circuit 740, which operates on the signals and then transmits them to antennas 750.

Digital circuit 730 is coupled to communicate with processor 710 and RF circuit 740. In some embodiments, digital circuit 730 includes circuitry to perform error detection/correction, interleaving, coding/decoding, or the like. Also in some embodiments, digital circuit 730 may implement all or a portion of a media access control (MAC) layer of a communications protocol. In some embodiments, a MAC layer implementation may be distributed between processor 710 and digital circuit 730.

Radio frequency circuit 740 may be adapted to receive and demodulate signals of various formats and at various frequencies. For example, RF circuit 740 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The present invention is not limited in this regard.

Antennas 750 may include one or more antennas. For example, antennas 750 may include a single directional antenna or an omni-directional antenna. As used herein, the term omni-directional antenna refers to any antenna having a substantially uniform pattern in at least one plane. For example, in some embodiments, antennas 750 may include a single omni-directional antenna such as a dipole antenna, or a quarter wave antenna. Also for example, in some embodiments, antennas 750 may include a single directional antenna such as a parabolic dish antenna or a Yagi antenna. In still further embodiments, antennas 750 may include multiple physical antennas. For example, in some embodiments, multiple antennas are utilized to support multiple-input-multiple-output (MIMO) processing or spatial-division multiple access (SDMA) processing.

Memory 725 represents an article that includes a machine readable medium. For example, memory 725 represents a random access memory (RAM), dynamic random access memory (DRAM), static random access memory (SRAM), read only memory (ROM), flash memory, or any other type of article that includes a medium readable by processor 710. Memory 725 may store instructions for performing the execution of the various method embodiments of the present invention. In operation, processor 710 reads instructions and data from either or both of flash memory device 720 and memory 725 and performs actions in response thereto. In some embodiments, flash memory device 720 and memory 725 are combined into a single memory device. For example, flash memory device 720 and memory 725 may both be include in a single flash memory device.

Although the various elements of system 700 are shown separate in FIG. 7, embodiments exist that combine the circuitry of processor 710, flash memory device 720, memory 725 and digital circuit 730 in a single integrated circuit. For example, memory 725 or flash memory device 720 may be an internal memory within processor 710 or may be a microprogram control store within processor 710. In some embodiments, the various elements of system 700 may be separately packaged and mounted on a common circuit board. In other embodiments, the various elements are separate integrated circuit dice packaged together, such as in a multi-chip module, and in still further embodiments, various elements are on the same integrated circuit die.

The type of interconnection between processor 710 and flash memory device 720 is not a limitation of the present invention. For example, bus 715 may be a serial interface, a test interface, a parallel interface, or any other type of interface capable of transferring command and status information between processor 710, flash memory device 720, and memory 725.

In some embodiments, flash memory device 720 may include NOR-type flash memory cells, and in other embodiments, flash memory device 720 may include NAND-type flash memory cells. Memory cells in flash memory device 720 may store one data bit per cell, or memory cells may be multilevel cells (MLC) capable of storing more than one bit per cell. Further, flash memory device 720 may include multiple interfaces that allow a first logical partition to store one data bit per cell, and a second logical partition to store more than one bit per cell. Any flash memory arrangement may be utilized within flash memory device 720 without departing from the scope of the present invention.

Flash memory devices, controllers, coarse verify circuits, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A method comprising:
   changing a gate voltage on at least one transistor in voltage steps of a first magnitude;
   detecting a change in threshold voltage of the at least one transistor; and
   changing the gate voltage on the at least one transistor in voltage steps of a second magnitude;
   wherein the second magnitude is smaller than the first magnitude.

2. The method of claim 1 wherein changing a gate voltage on at least one transistor in voltage steps of a first magnitude comprises changing a gate voltage on multiple transistors.

3. The method of claim 2 wherein detecting comprises detecting a change in threshold voltage of any one of the multiple transistors.

4. The method of claim 3 wherein detecting a change in threshold voltage comprises comparing the threshold voltage to a first reference.

5. The method of claim 4 further comprising comparing the threshold voltage to a second reference.

6. The method of claim 5 wherein comparing the threshold voltage to a second reference comprises detecting whether the threshold voltage of any of the multiple transistors is above the second reference.

7. The method of claim 6 further comprising continuing to change the gate voltage of transistors with a threshold voltage below the second reference.

8. A flash memory device with write hardware and software to pulse gates of floating gate transistors with voltages that change first in coarse steps, and then in fine steps, wherein the write hardware comprises verify hardware to compare threshold voltages of the floating gate transistors against a first reference, the flash memory device further comprising a controller responsive to the verify hardware to change the voltages on the gates of the floating gate transistors, wherein the controller changes the voltages in coarse steps until the verify hardware provides an indication that any one of the threshold voltages has passed the first reference, and thereafter changes the voltages only in fine steps.

9. The flash memory device of claim 8 wherein the flash memory device comprises multi-level cells (MLC), each having one of the floating gate transistors.

10. The flash memory device of claim 9 wherein the write hardware and software provide coarse and fine voltage steps for programming states "01" and "10".

11. The flash memory device of claim 10 wherein the write hardware and software provide one coarse step to cells being written "01" and one coarse step to cells being written "10" and then perform a coarse verify.

12. The flash memory device of claim 9 wherein each of the multi-level cells can be programmed with any of four threshold voltages.

13. The flash memory device of claim 12 wherein the four threshold voltages comprise a low level, a high level, and two intermediate levels.

14. The flash memory device of claim 13 wherein the write hardware and software operate in coarse steps and fine steps for programming the two intermediate levels.

15. A flash memory comprising:
   bit lines and word lines;
   an array of multi-level cells (MLC) coupled to the bit lines and word lines; and
   a controller to increase voltages on word lines in coarse steps and fine steps;
   wherein the controller changes from coarse steps to fine steps on all word lines being driven when any cell being written has a threshold voltage greater than a reference.

16. The flash memory of claim 15 further comprising a coarse verify circuit to signal to the controller to change from coarse steps to fine steps.

17. The flash memory of claim 16 further comprising sensing circuits to compare threshold voltages of cells being written to a reference voltage.

18. The flash memory of claim 17 wherein the coarse verify circuit is coupled to be responsive to the sensing circuits.

19. The flash memory of claim 18 wherein the coarse verify circuit provides a signal to the controller to change from coarse steps to fine steps when any of the threshold voltages surpasses the reference voltage.

20. The flash memory of claim 15 wherein each of the multi-level cells can be programmed with any of four threshold voltages.

21. The flash memory of claim 20 wherein the four threshold voltages comprise a low level, a high level, and two intermediate levels.

22. The flash memory of claim 21 wherein the controller operates in coarse steps and fine steps for programming the two intermediate levels.

23. An electronic system comprising:
multiple antennas;
radio frequency circuitry coupled to the multiple antennas;
a processor coupled to the radio frequency circuitry; and
a flash memory device coupled to the processor, the flash memory device including write hardware and software to pulse gates of floating gate transistors with voltages that change first in coarse steps, and then in fine steps, wherein the write hardware comprises verify hardware to compare threshold voltages of the floating gate transistors against a first reference, the flash memory device further comprising a controller responsive to the verify hardware to change the voltages on the gates of the floating gate transistors, wherein the controller changes the voltages in coarse steps until the verify hardware provides an indication that any one of the threshold voltages has passed the first reference, and thereafter changes the voltages only in fine steps.

24. The electronic system of claim 23 wherein the flash memory device comprises multi-level cells (MLC), each having one of the floating gate transistors.

* * * * *